United States Patent [19]
Shibib

[11] Patent Number: 5,557,125
[45] Date of Patent: Sep. 17, 1996

[54] DIELECTRICALLY ISOLATED SEMICONDUCTOR DEVICES HAVING IMPROVED CHARACTERISTICS

[75] Inventor: Muhammed A. Shibib, Wyomissing Hills, Pa.

[73] Assignee: Lucent Technologies Inc., Murray Hill, N.J.

[21] Appl. No.: 163,954

[22] Filed: Dec. 8, 1993

[51] Int. Cl.⁶ .................................................. H01L 29/00
[52] U.S. Cl. .......................... 257/329; 257/334; 257/370; 257/374; 257/376; 257/519
[58] Field of Search .................................... 257/329, 370, 257/371, 374, 376, 511, 146, 378, 331, 334, 369, 519

[56] References Cited

U.S. PATENT DOCUMENTS

| | | | |
|---|---|---|---|
| 4,366,495 | 12/1982 | Goodman et al. | 257/342 |
| 4,835,113 | 5/1989 | Celler et al. | 437/37 |
| 5,065,219 | 11/1991 | Terashima | 257/524 |
| 5,128,739 | 7/1992 | Shirato | 257/371 X |
| 5,306,942 | 4/1994 | Fujii | 257/374 X |
| 5,410,170 | 4/1995 | Bulucea et al. | 257/331 X |

FOREIGN PATENT DOCUMENTS

| | | | |
|---|---|---|---|
| 0216380 | 4/1987 | European Pat. Off. | H01L 29/06 |
| 5627942 | 3/1981 | Japan . | |
| 60245248 | 12/1985 | Japan . | |
| 62185372 | 8/1987 | Japan . | |
| 63281468 | 11/1988 | Japan . | |
| 8604455 | 7/1986 | WIPO | H01L 21/76 |

OTHER PUBLICATIONS

Pat. Abs. of Japan, vol. 13, No. 110, Mar. 1989.
Pat. Abs. of Japan, vol. 12, No. 26, Jan., 1988.
Pat. Abs. of Japan, vol. 5, No. 78 (E–58) [750], May, 1981.
Pat. Abs. of Japan, vol. 10, No. 108 (E–397) [2165], Apr. 1986.

*Primary Examiner*—William Mintel

[57] ABSTRACT

Dielectrically isolated semiconductor devices such as DMOS and ZGBT devices comprise a substrate having upper and lower surfaces. Source, drain and channel regions are disposed along the upper surface. The drain region extends downwardly to the lower surface of the substrate and laterally beneath the source and channel region. The drain merges with an underlying region of high conductivity. The underlying region is generally flat except for an upwardly extending portion thereof laterally disposed from the source region and providing a lower resistance path for current through the drain region. The DMOS devices can be included within an integrated circuit chip containing other types of semiconductor devices.

7 Claims, 3 Drawing Sheets

DIELECTRICALLY ISOLATED SEMICONDUCTOR DEVICES HAVING IMPROVED CHARACTERISTICS

BACKGROUND OF THE INVENTION

This invention relates primarily to dielectricaly isolated devices within semiconductor integrated circuits, and particularly, to such devices having "vertical" configurations providing high voltage capability. The invention also relates to discrete DMOS devices, particularly to Double Diffusion Metal Oxide Semiconductor (DMOS) and Insulated Gate Bipolar Transistor (IGBT) devices.

Integrated circuits with which the present invention has utility are known. One class of such circuits is described in "An Analog/Digital BCDMOS Technology with Dielectric Isolation-Devices and Processes", Chih-Yuan Lu, et al, IEEE Transactions on Electron Devices, Vol. 35, No. 2, February 1988, pages 230–237. In such integrated circuits, various different types of semiconductor devices, e.g., bipolar, Complimentary MOS (CMOS), DMOS, p-n-p-n, Junction FET (JFET) and Dual Gate DMOS (DGDMOS) devices are integrated within a single semiconductor chip. This is made possible by the use of device structures and processes which are compatible with all the different types of devices included on the chip, even though not all the devices are optimized in their performance. In particular, and with respect to the present invention, in order to provide certain ones of the devices with high voltage capability, particularly the DMOS and IGBT devices (described further hereinafter), the devices are formed within deep tubs providing large vertical distances for withstanding high voltages. Doped regions are formed at both the top and bottom surfaces of the tubs, and, in the different devices within the chip, the different doped regions provide different functions, depending upon the particular devices involved. For example, in the DMOS devices, the bottom doped region serves as a highly conductive channel for current passing between source and drain regions of the device. In bipolar transistors, the bottom doped region serves as the device collector. A problem, however, is that while the distance of the bottom doped regions from the upper doped regions is optimized for the DMOS devices, such distance is generally higher than optimal for the other devices within the chip.

The present invention has utility for better optimizing the dimensions of various devices in integrated circuits of the type described above.

In addition, the present invention has utility in DMOS and IGBT devices in general, whether integrated or not.

DMOS devices are well known, wherein the "D" stands for "diffusion" or "double diffusion". Such devices comprise (FIG. 1) a substrate 10 of semiconductor material having on a surface thereof a layer 12 of gate oxide covered by a gate electrode 14. The device is of cellular type, including spaced apart portions connected in parallel. Plural source regions comprise first doped regions 16, e.g. of N type conductivity, formed within second doped regions 18 of opposite type conductivity, e.g. of P type conductivity, with the regions 18 being formed within the substrate, e.g. of N type conductivity. The regions 16 and 18 are formed by successive ion implantations using the gate electrode 14 as a mask and by heating for causing lateral diffusions of the various regions under the gate electrode. The second doped regions 18 extend laterally further beneath the gate oxide than the first regions 16, and the portions 20 of the second regions 18 extending beyond the first regions 16 beneath the gate oxide comprise the channel regions of the device. The gate electrode 14 also overlies surface portions 22 of the N type substrate 10. The substrate beneath the surface portions 22 comprises the drain region of the device.

In operation, when the channel regions 20 are in a conductive state, under control of the gate electrode, current flows from a source electrode 24 contacting surface portions of the first 16 and second 18 regions through the first regions 16, through the channel regions 20, and into the substrate 10 at the surface portions 22. The current flows through the substrate 10 (drain region) to a drain electrode 26 contacting the substrate surface at a position laterally remote from the first and second regions.

Such DMOS devices are used in power controlling applications involving relatively high voltages and currents and, to this end, the substrate portions directly adjoining the second regions 18 are lightly doped and overlie a heavily doped region 28 which extends laterally along the bottom of the substrate and then vertically upwardly to the drain electrode 26. Accordingly, when the device is in the switched-on state, current flows first laterally through the channel regions 20 beneath the gate electrode 12 to the substrate portions 22 and then vertically downwardly through the substrate 10 to the underlying heavily doped region 28 which conducts the current to the drain electrode 26.

When the device is in its switched-off state, with a voltage applied between the source and drain regions, the applied voltage is "withstood" across the p-n junctions 30 between the P regions 18 and the N substrate 10; that is, the applied voltage reverse biases the p-n junctions 30. Depletion regions are thus formed on opposite sides of the p-n junctions 30, and, because of the low doping of the substrate (much lower than that of the second region 18) the width of the depletion regions within the substrate 10 primarily determines the stand-off voltage capability of the device. The maximum widths of the depletion regions correspond substantially to the distance between the p-n junctions 30 and the heavily doped region 28 beneath the second regions 18. Thus, when the depletion regions reach the heavily doped region 28, further expansion of the depletion regions with increasing applied voltage substantially ceases, the electric field intensity through the substrate increases, and voltage breakdown of the device occurs.

The vertical distance Ba between the second regions 18 and the underlying region 28 largely influences two parameters of the device. One parameter is the on-current resistance of the device because the current flows through this vertical distance to reach the region 28. The other parameter is the breakdown voltage rating of the device. The vertical distance, however, has opposite effects on these two parameters. A desired low on-current resistance requires a short vertical distance, while a desired high voltage breakdown requires a long vertical length.

Insulated Gate Bipolar Transistors (IGBT) can be identical to the DMOS devices illustrated in FIG. 1 except that the high conductivity region 28 is of opposite type conductivity to that of the overlying region 10. In terms of the foregoing, conflicting requirements of DMOS devices are also present in IGBT devices.

The present invention provides a means for better reconciling these conflicting requirements. Also, as described hereinafter, such reconciling means is useful in integrated circuits of the type hereinafter described for better optimizing the characteristics of various types of devices contained therein.

SUMMARY OF THE INVENTION

In accordance with one aspect of the invention, semiconductor devices comprise a substrate having upper and lower surfaces. Disposed directly over a first portion of the upper surface is a gate structure comprising a gate electrode overlying a dielectric material layer. Disposed within the substrate at the upper surface and partially underlying the gate structure are first and second doped regions. The second doped region forms a first p-n junction with the substrate, which first junction extends to and has an intercept with the substrate upper surface. The first region is disposed within the second region and forms a second p-n junction also having an intercept with the substrate upper surface. Both p-n intercepts are overlaid by the gate structure. Disposed within the substrate along the lower surface is a highly conductive region which underlies both the upper surface first portion and the first and second doped regions. The highly conductive region is shaped such that the vertical distance between the region and the substrate upper surface is less beneath the surface first portion than beneath the first and second doped regions.

In accordance with another aspect of the invention, various devices according to the invention are disposed within identical tubs within a semiconductor chip. Each tub includes a substrate extending between top and bottom surfaces of the tub, and each tub includes a first doped region disposed along the tub bottom surface. Each first doped region has a generally centrally disposed portion which projects upwardly towards the tub upper surface and towards a second doped region at the tub upper surface forming, in cooperation with the first doped region, components of vertically oriented semiconductor devices.

DETAILED DESCRIPTION OF PREFERRED EMBODIMENTS

Figure 2:
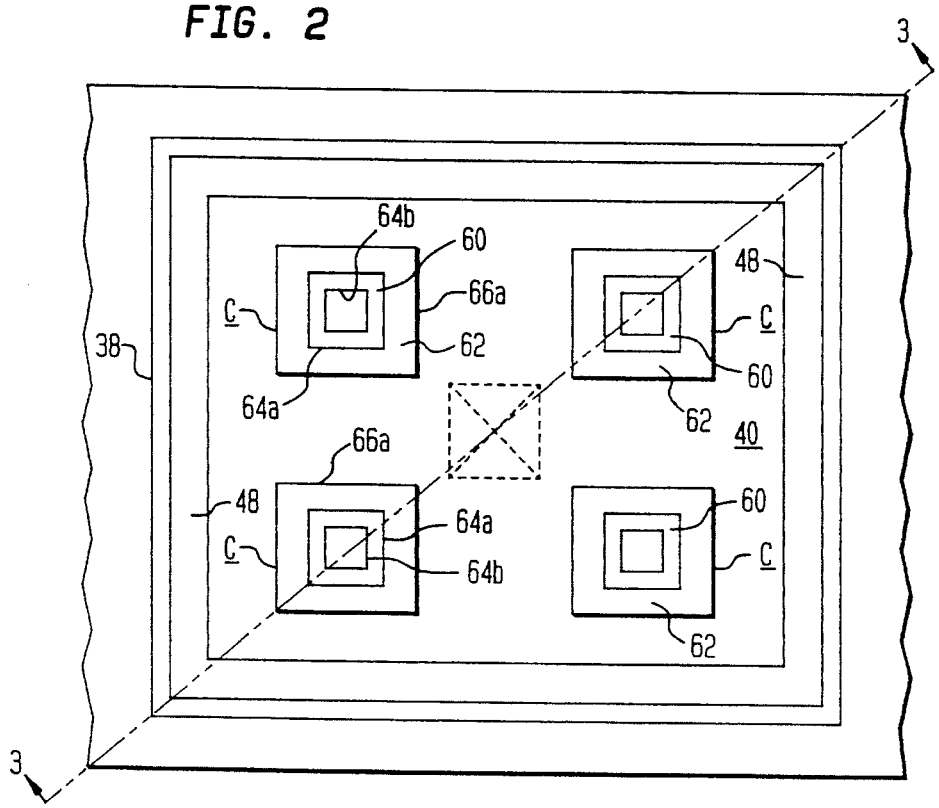
FIG. 2 is a plan view of the surface of a semiconductor wafer containing a dielectrically isolated DMOS device in accordance with this invention, such surface lying in the plane marked 2—2 in FIG. 3.
Figure 3:
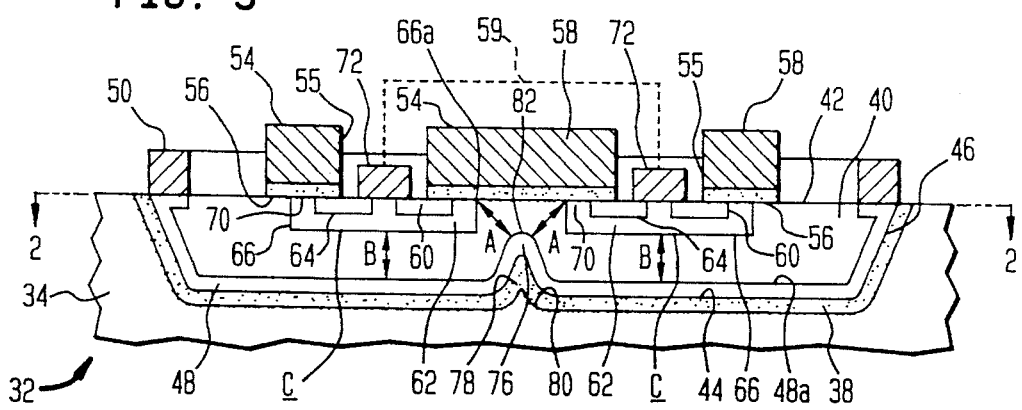
FIG. 3 is a section of the device shown in FIG. 2 taken along line 3—3 of FIG. 2.

With reference to FIGS. 2 and 3, a portion of an integrated semiconductor device is shown, such portion comprising a small part of a silicon chip 34 containing the integrated circuit. Integrated semiconductor devices of the type with which the present inventive device has utility are well known and described in the afore-cited IEEE article. Generally, the present invention provides an improvement in known DMOS and IGBT devices and can be used in such devices whether integrated or not. The invention has particular utility, however, in dielectrically isolated DMOS and IGBT devices, and a DMOS device, identified by the reference numeral 32, is first described. Disposed within the chip 34, and dielectrically isolated from it by a layer 38 of silicon dioxide, is a body 40 of silicon. For generalizing the description, the silicon body 40 is referred to as a substrate. In this embodiment, the substrate is of N-type conductivity.

The substrate 40 has two opposed surfaces, that is, an upper surface 42 and a lower surface 44 joined by a side surface 46. Adjoining the lower 44 and side 46 surfaces is a region 48 of $N^+$ material, that is a portion of the substrate 40 which is heavily doped with an impurity providing N-type conductivity. The region 48 extends to the upper surface 42 of the substrate 40 where it is contacted by a drain electrode 50, e.g., of aluminum. The purpose of the heavily doped region 48 is to provide a low resistance path for current to the drain electrode 50. For this reason, the region 48 is hereinafter referred to as the "conductive channel" 48.

Disposed over a central portion of the substrate 40 is a gate electrode structure 54 comprising a dielectric layer 56, e.g., silicon dioxide, overlaid with a gate electrode 58, e.g., of doped polysilicon.

The device 32 shown is of the cellular type and comprises (FIG. 2) four cells C connected in parallel and sharing common elements of the composite device. FIG. 2 is a plan view of the device from the surface 42 thereof and does not show the various layers on the surface 42. As generally known, the gate electrode structure 54 (FIG. 3) covers substantially the entire surface 42 but has openings 55 therethrough. The various cells C are connected together by a conductive layer (shown schematically by a dashed line 59) which overlies the gate structure 54 but is separated therefrom by a layer of insulating material.

Disposed within the substrate 40 and within each cell C (there being four identical cells C in this embodiment) is a first doped region 60 having (FIG. 2) an annular shape, the first doped region 60 being disposed within a square shaped second doped region 62. The first doped region 60 is of $N^+$ conductivity and forms a p-n junction 64 with the second region 62 of P-type conductivity.

The second region 62 forms a p-n junction 66 with the substrate 40. Both p-n junctions 64 and 66 extend towards and have surface intercepts with the substrate upper surface 42. The p-n junction 64, owing to the annular shape of the first region 60, forms two spaced apart surface intercepts 64a and 64b (FIG. 2) with the surface 42, and the outer intercept 64a (of each cell C) is disposed beneath the gate electrode structure 54. The surface intercept 66a of the p-n junction 66 is also disposed beneath the gate structure 54, and the upper portion 70 of the second region 62 (surrounding the outer periphery of the first region 60 and disposed between the two surface intercepts 64a and 66a) comprises the channel region of the DMOS device.

The first region 60 comprises the source region of the DMOS device cells, and a source electrode 72, e.g., of aluminum, contacts the surface of the first region 60. The electrode 72 also contacts the surface of the second region 62. As schematically indicated in FIG. 3, the source electrodes 72 of the two cells C (as well as the other two cells C shown in FIG. 21 are connected together by a conductive layer 59. The substrate 40 comprises the drain region of the composite device, i.e., it underlies all the cells C and is contacted by the previously described annular drain electrode 50.

Figure 1:
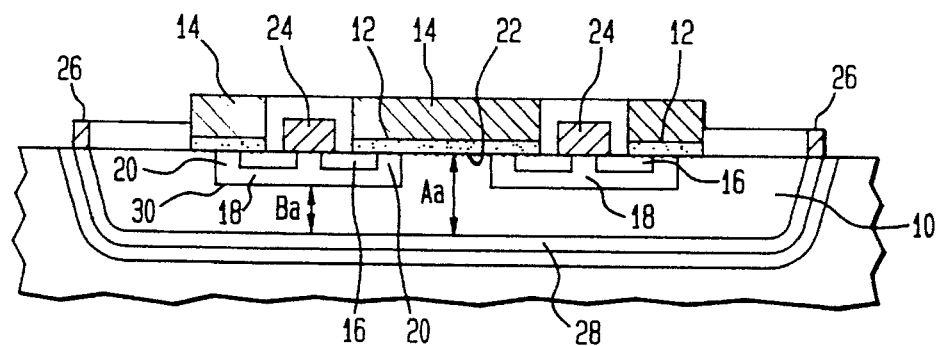
FIG. 1 is a cross-sectional view of a prior art DMOS device.

To the extent so far described, the DMOS device shown in FIGS. 2 and 3 is substantially identical to the prior art DMOS device shown in FIG. 1 (and substantially identical, when the region 48 is of P type conductivity, to known IGBT devices). In accordance with this invention, a difference from the prior art is the shape of the conductive channel 48 at the bottom of the substrate 40. As shown in FIG. 3, the channel 48 at the center of the device includes an upwardly extending protrusion 76, e.g., having the shape (in this embodiment of the invention) of a four sided pyramid. In the prior art (FIG. 1) the conductive channel 28 is flat along the entire flat bottom-surface of the substrate.

As shown in FIG. 3, the pyramidal protrusion 76 is formed around a pyramid 78 formed in the silicon dioxide layer 38, and the pyramid 78 is formed around a pyramid 80 in the wall of the chip 34 underlying the substrate 40. The fabrication of the various pyramids is described hereinafter.

The effect of the pyramid 76 in the conductive channel 48 is to reduce the vertical distance between the channel 48 where the channel underlies a central portion of the substrate surface 42 surrounded by the second regions 62. More specifically, the height of the pyramid 76 is such that the distance A between the peak 82 of the pyramid 76 and the surface intercepts 66a of the p-n junctions 66 is substantially equal to the vertical distance B between the bottom-most portion of the p-n junction 66 and the underlying upper surface 48a of the conductive channel 48.

In contrast, in the prior art devices (FIG. 1), the distance between the conductive channel 28 and the substrate upper surface is uniform throughout the device (excepting where the conductive channel 28 rises to the substrate upper surface).

The importance of this structural change from the prior art is explained as follows:

During use of the DMOS device 32, a voltage is applied between the source electrode 72 and the drain electrode 50, with the drain electrode voltage being positive with respect to the source electrode. Such polarity voltage across the device 32 reverse biases the p-n junction 66 between the second region 62 of each cell C and the substrate 40. As previously explained, the device will withstand the applied voltage, without voltage breakdown, provided the depletion region formed within the substrate 40 does not penetrate substantially into the conductive channel 48. Accordingly, with a given low level doping of the substrate 40, the voltage breakdown capability of the device is a direct function of the vertical distance B. Note that, in the prior art device shown in FIG. 1, the distance Aa is greater than the distance Ba, but this greater distance has no effect on the breakdown capability of the device. That is, once the depletion region from the bottommost portion of the second region 18 reaches the conductive channel 28, voltage breakdown will shortly occur (with further increases of applied voltage).

When the inventive device 32 is switched on, as by applying a positive voltage to the gate electrode 58 for switching the conductivity of the channel region 70 between the source region 60 and the drain region 40 of each of the cells C, current flows from the source regions 60 through the channel regions 70 of the cells C and into the drain region 40. The channel regions 70 are switched only closely adjacent to the substrate surface 42 and the current from the various channel regions 70 enters the drain region 40 just beneath the substrate surface 42. From there, the current travels vertically downwardly to the conductive channel 48 through which the current passes to the drain electrode 50.

The on-resistance of DMOS devices, that is the resistance to current flow when the device is switched on, is a function of the length of the current path through the device. In the prior art device shown in FIG. 1, the path Aa for the current through a portion of the substrate 28 of low conductivity is longer than the corresponding path length A in the inventive device shown in FIG. 3. Accordingly, the on-resistance of the FIG. 3 device, all other parameters being equal, is less than that of the FIG. 1 device.

As previously noted, because the voltage breakdown capability of the device is a function of the distance B, reducing the distance A, providing the distance A does not become less than distance B, does not affect the device voltage breakdown capability. In practice, the distance A is made slightly greater than the distance B. The actual dimensions involved depend upon the size of the DMOS device and its ratings, and such dimensions can be readily selected by persons of skill in this art.

Reducing the distance A, however, does reduce the on-resistance of the device. In a situation where the parameters of the devices shown in FIGS. 1 and 3 are identical, except for the central pyramid 76 in the FIG. 3 device, the inventive FIG. 3 device has lower on-resistance than the FIG. 1 device and the same voltage breakdown capability. Conversely, the inventive device can be provided, in comparison with the FIG. 1 device, with a larger voltage breakdown capability by increasing the distance B, while providing the same on-resistance of the FIG. 1 device.

IGBT devices perform similarly to DMOS devices and the foregoing discussion applies, in general, to IGBT devices.

The particular shape of the upwardly extending protrusion 76 (FIG. 3) is not critical. However, as previously indicated, the invention has particular utility in the fabrication of dielectrically isolated DMOS and IGBT devices, and, in such devices, the particular pyramidal structure shown in FIG. 3 follows automatically from a preferred method of fabrication. This is now described.

The starting workpiece (FIG. 4), for the fabrication of an N-channel DMOS, is a wafer of monocrystalline silicon of N type conductivity. Herein is shown only a small portion 82 of the wafer, that is, a portion in which a single, dielectrically isolated DMOS is to be made. The processing of wafers to simultaneously form a plurality of individual, dielectrically isolated DMOS devices within integrated circuits is well known, and known processing details are omitted from the following description.

Figure 5:
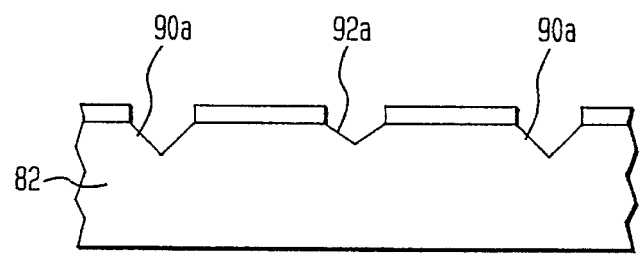
Figure 6:
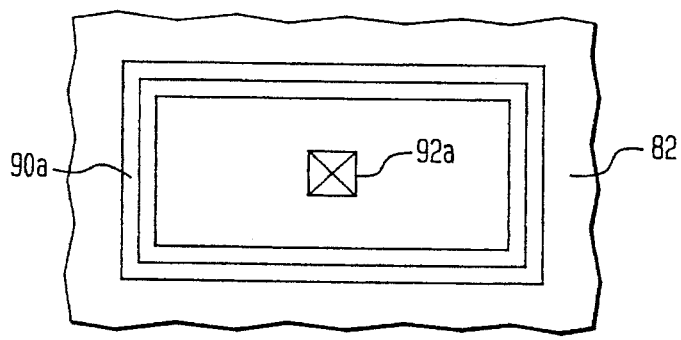
FIG. 6 is a plan view of the device shown in FIG. 5.

The (100) surface 86 of the silicon wafer is oxidized to form a layer 88 of silicon dioxide which is patterned to provide a number of openings 90 and 92 (FIG. 4) therethrough. The wafer is then exposed to an etchant (KOH) for anisotropically etching grooves 90a and 92a (FIGS. 5 and 6) into the surface having a V-shaped cross-section. The depths of the grooves are a function of the dimensions of the openings 90 and 92. As shown in FIG. 6, a continuous V-shaped groove 90a is provided around the outer sides of the wafer portion 82 and a pyramidal shaped groove or cavity 92a is formed in the center of the wafer portion.

Then, the oxide layer 88 is removed, and (FIG. 7) N type conductivity ions, e.g., arsenic, are implanted through the surface to form an N+ layer 48 (see, also, FIG. 2) which underlies the various grooves 90a and 92a. The surface 86 is then oxidized to form a layer 38 of silicon dioxide overlying the N+ layer 48.

The process described herein can be used to fabricate IGBT devices except that P type conductivity ions, e.g., boron, are used to form a P+ region 48.

A layer 34 of polysilicon is then deposited onto the oxide layer 38 and into the grooves 90a and 92a.

Figure 7:
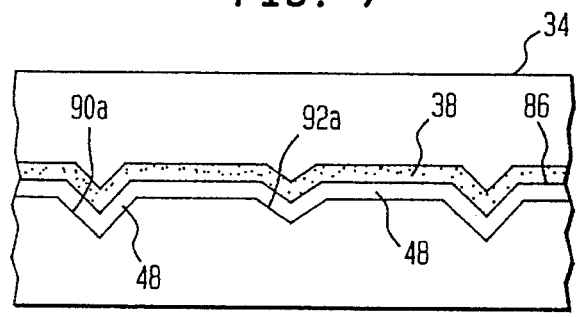
Figure 8:
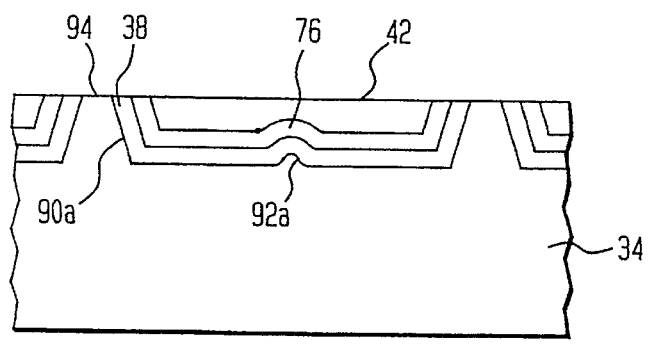

FIG. 8 shows the workpiece turned upside down from the position shown in FIG. 7. Also, the (now) upper portion of the wafer has been ground away to provide a surface 42 extending just through the tops 94 of the V-shaped "ridges" 90a (i.e., the bottom of the V-shaped grooves 90a shown in FIG. 7). The new surface 42 cuts through the oxide layer 38 overlying the ridges 90a, which surface exposed oxide layer 38 forms a surface boundary for the DMOS device being made.

At this stage in the fabrication sequence, the wafer portion 82, shown in FIG. 8, corresponds to portions of the device 32 shown in FIG. 2.

Completion of the device 32, from the workpiece shown in FIG. 8, can be by identical processes used in the fabrication of known DMOS devices of the type shown in FIG. 1.

Indeed, in terms of fabrication of the inventive DMOS devices, all the processes used can be identical to those used in the fabrication of the prior art DMOS devices. The only difference present in the fabrication processes is the provision of the opening 92 (FIG. 4) through the oxide layer 88 in the center of the wafer portion 82. This opening 92 and 92a shown in FIGS. 5, 6, 7 and 8, not present in the prior art process, gives rise to the pyramidal shaped protrusion 76 (FIG. 3) in the inventive device 32 and provides the described improved device characteristics. Significantly, however, providing the additional opening 92 through the oxide layer 88 adds no cost to the prior art process (merely requiring a change in the photomask used in the process), and the structural change from the prior art devices described herein can thus be obtained at no additional processing cost over that of the prior art devices.

While the use of such pyramidal protrusions 76 is desirable because of its compatibility with existing fabrication processes, the device improvements can be obtained using other configurations, e.g., conical or cylindrical protrusions and the like.

Figure 9:
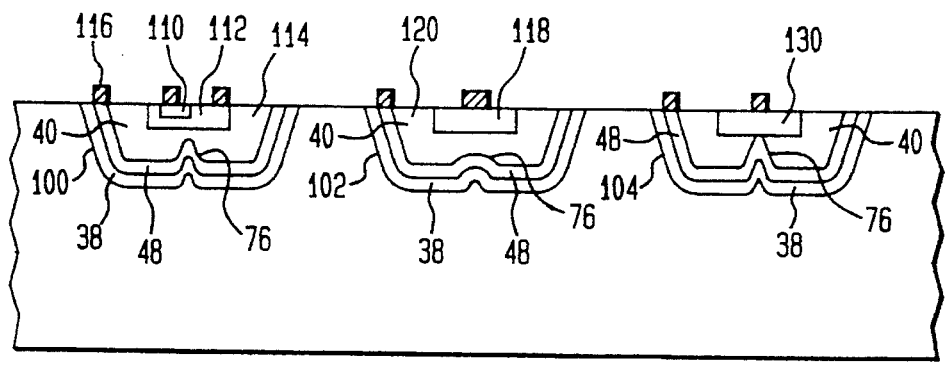
FIG. 9 is a view in section of a portion of an integrated circuit chip showing several dielectrically isolated devices in accordance with the invention.

As previously noted, the invention is not limited for use in DMOS and IGBT devices. FIG. 9 is a view of a portion of an integrated circuit chip including a plurality of identical tubs 100, 102 and 104, each of which includes a body 40 of semiconductor material surrounded by a wall 38 of silicon dioxide providing dielectric isolation for the device within the tub. Another two, not shown in FIG. 9, can include a DMOS device such as the device 32 shown in FIGS. 2 and 3. Also, the various tubs can be formed using the identical process described in connection with FIGS. 4 through 8. Thus, all of the tubs contain a central pyramidal protrusion 76 in a highly doped region 48 (N-type in the illustrated embodiment) providing a variable spacing between the region 48 and various overlying doped regions. Although not illustrated, tubs containing P type regions 48 would normally also be provided, such tubs containing IGBT devices, as well as various devices illustrated herein but of opposite type polarity, e.g., P type channel DMOS devices rather than, or in addition to, the N type channel DMOS devices herein described.

Considering the devices shown in the tubs 100 and 102 (but not the tub 104), it is first noted that, except for the pyramidal protrusion 76, the devices illustrated are identical to known devices of the type described in the afore-cited IEEE Transaction article. That is, as is the situation with the prior art device shown in FIG. 1, all the known devices are formed in tubs having flat bottom surfaces.

All the various tubs 100, 102 and 104 have the same vertical dimension. This results from the fact that all the tubs are simultaneously formed in the integrated circuit chip. Basically, the vertical dimension is determined by the voltage rating of the devices in the integrated circuit having to withstand the largest voltages and, generally, the vertical dimension is greater than the optimal value for devices other than the high voltage devices. The presence of the pyramidal (or other shape) protrusion serves to reduce the effective vertical height of the devices, hence tends to better optimize the characteristics thereof.

Thus, the tub 100 contains an n-p-n transistor comprising an N emitter 110, a P base 112 and an N collector 114. Current flows first vertically from the emitter 110 through the base 112 to the collector 114, thence horizontally and vertically through the highly doped region 48 to the collector electrode 116. While the highly doped region 48 is part of the collector region 114, the resistance thereof is so much less than the remainder of the collector region overlying it, that the region can be considered part of the collector electrode 116. The presence of the protrusion 76 thus at least partially reduces the length of the vertical path for current through the collector 114, hence results in lower collector resistance and lower collector-emitter saturation voltage.

The tub 102 contains a diode comprising an anode region 118 and a cathode region 120. Similarly, as before described, the protrusion 76 reduces the length of the vertical path for current through the cathode region 112, hence results in lower on-resistance of the device.

Figure 10:
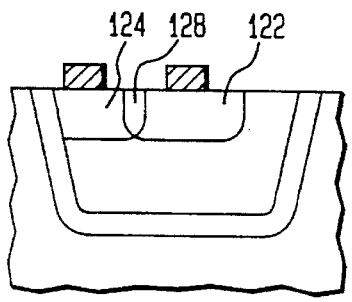
FIG. 10 is a view similar to FIG. 9 but showing a prior art Zener diode.

The device in the tub 104, owing to the presence of the protrusion 76, is different from a corresponding prior art device shown in FIG. 10. The FIG. 10 prior art device is a Zener diode of the surface type comprising an anode region 122 overlapping a cathode region 124, the overlapped regions providing a junction 128 between the two regions 122 and 129.

Within the tub 104, however, the Zener diode, in accordance with this invention, is of the buried type wherein the anode region 130 forms a p-n junction with the upwardly protected portion 76 of the highly doped region 48. As known, Zener diodes of the buried type (made possible because of the protrusion 76) are more stable and reliable than Zener diodes of the surface type because of avoidance of a surface intercept of the p-n junction.

Figure 4:
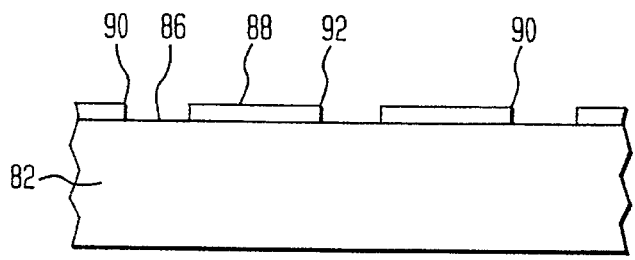
FIGS. 4, 5, 7 and 8 are views similar to FIG. 2 but showing successive steps in the fabrication of the DMOS device shown in FIGS. 2 and 3.

As previously noted, the vertical heights of the various tubs 100, 102 and 104 are the same as a result of how the integrated circuit chip is fabricated, particularly as the result (FIGS. 7 and 8) of the grinding operation resulting in a flat surface exposing the tops 94 of the silicon dioxide ridges. This requires that all the V grooves 90a (FIG. 5) have the same depth. Conversely, however, different height protrusions 76 can be provided by varying the depths of the central groove 92a (FIG. 5) used to form the protrusions. As previously noted, this is accomplished by varying the size of the opening 92 (FIG. 4). Varying the height of pyramidal protrusions also varies the base dimensions thereof because the angles of inclination of the pyramid sides are fixed by the anisotropic etching of the silicon crystal.

Figure 11:
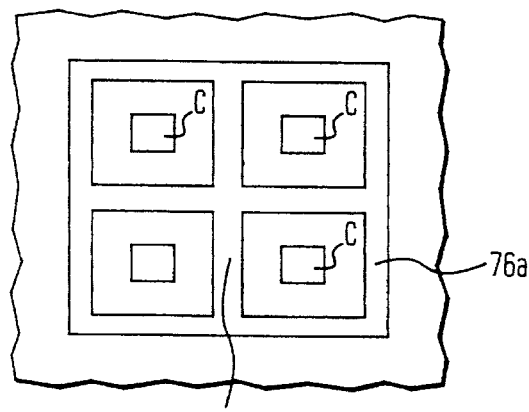
FIG. 11 is a view similar to FIG. 2 but showing a variation therefrom.

Additionally, even with protrusions formed by anisotropic etching, other protrusion shapes can be formed, e.g., elongated ridges of inverted V shape. Also, the ridges can be of different heights and two or more ridges can be provided in various parallel and perpendicular configurations. FIG. 11, for example, shows four cells C, such as shown in FIG. 2, where each of the cells is completely surrounded by ridges 76a forming a grid of intersecting ridges. The ridges 76a can be formed identically as the peripheral ridges 90a (FIG. 8), but of shorter heights.

Figure 12:
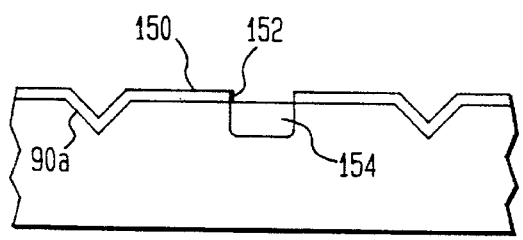
FIGS. 12–14 are views similar to FIGS. 4, 5, 7 and 8 but showing successive steps an the fabrication of another device in accordance with this invention.
Figure 13:
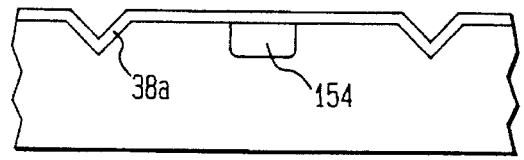
Figure 14:
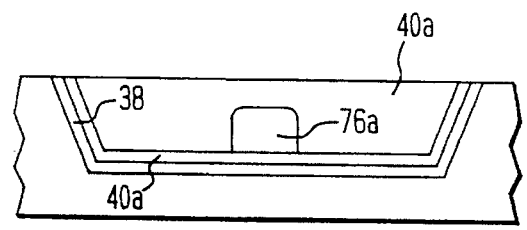

As explained, the pyramidal protrusions, as well as elongated ridge protrusions, can be provided without additional expensive steps (except for a minor photomask revision expense) using presently used fabrication processes. While this is desirable for cost reasons, it does not preclude the use of other processes for providing the protrusions in the highly doped regions 48 at the bottoms of the devices. For example, FIG. 12 shows a workpiece at a stage of fabrication where grooves 90a have been formed (similarly as in FIG. 5); but no central groove 92a. Instead, the surface of the workpiece, including the grooves 90a, is covered with a photoresistant layer 150 which is patterned to provide an opening 152. Then, a dopant is introduced to form a downwardly extending highly doped region 154. Then, FIG. 13, the photoresistant layer 150 is removed and a similar conductivity type dopant is introduced through the entire exposed surface of the workpiece to form the highly doped region 40a. Subsequent processing is as shown in FIGS. 7 and 8 resulting in a workpiece, such as shown in FIG. 14, having a flat bottomed substrate 40a, that is, without a pyramidal protrusion, but with an upwardly extending portion 76a of the region 40a. In terms of function, the workpiece shown in FIG. 14 is the equivalent of the workpiece shown in FIG. 8.

What is claimed is:

1. An MOS device comprising a substrate having first and second oppositely disposed surfaces, a gate electrode overlying a portion of said first surface and extending continuously between first and second positions on said first surface, a first region disposed within said substrate at said first surface, said first region being disposed within a second region within said substrate, said first and second regions forming therebetween a p-n junction having a first intercept with said first surface and underlying said gate electrode at said first position, said second region and said substrate forming therebetween a p-n junction having a second intercept with said first surface and underlying said gate electrode at a third position spaced from said first and second positions, said substrate including a third region of a first electrical conductivity type underlying and contiguous with said second region and extending to said first surface between said third and second positions, and a fourth region of a second electrical conductivity type contiguous with and underlying said third region said third and fourth regions forming a p-n junction therebetween, the distance between said fourth region and said first surface being less where said fourth region underlies said first surface between said second and third positions than where said fourth region underlies said second region.

2. An MOS device according to claim 1, wherein said substrate is of silicon, said substrate second surface is in contact with a layer of silicon dioxide overlying a layer of polysilicon, said polysilicon layer being generally flat where it underlies said substrate second surface except for a first ridge projecting upwardly towards first surface and along a direction intersecting said first surface between said second and third positions thereof, said layer of silicon dioxide including an upwardly projecting second ridge overlying and conforming in shape to said first ridge, and said substrate second surface including an upwardly projecting third ridge overlying and conforming in shape to said second ridge.

3. An MOS device comprising a substrate of semiconductor material having upper and lower oppositely disposed surfaces, said substrate containing source, channel and drain regions disposed in succession adjoining said upper surface, said drain region extending to said lower surface and underlying said source and channel regions, said source region being disposed within a first doped region forming a p-n junction with said drain region and underlying said source region, and a second region of opposite conductivity type as said drain region electrical conductivity extending along said lower surface and spaced from said upper surface, the spacing between said second region channel and said upper surface being less where said drain region adjoins said upper surface than where the p-n junction underlies said source region.

4. An MOS device comprising a substrate having top and bottom surfaces, said substrate including a first region extending from a first portion of said top surface downwardly towards said bottom surface and being of a first type conductivity, a second region of a second type conductivity disposed within said substrate at said top surface and spaced from said bottom surface, said second region forming a first p-n junction with said first region, said first junction having a first intercept with said top surface, a third region of said first type conductivity disposed within said second region and forming a second p-n junction therewith, said second p-n junction having a second intercept with said top surface, a gate electrode overlying said first portion of said top surface and said first and second intercepts, a fourth region of said second conductivity type being disposed within said substrate underlying and spaced from said second region and underlying said first region, said fourth region having a higher electrical conductivity than said first region, and said fourth region being shaped such that the vertical distance between said fourth region and said top surface is less under said first portion of said top surface than under said second region.

5. An MOS device according to claim 4 wherein said top and bottom surfaces are generally parallel except for an upwardly extending protrusion in said bottom surface underlying said first portion of said top surface, said fourth region having a layer-like shape conforming to the shape of said bottom surface.

6. An integrated circuit comprising a semiconductor chip containing a plurality of tubs therein, each of said tubs comprising a bottom wall and a side wall extending upwardly therefrom, said walls being of an electrically insulating material, a substrate of semiconductor material of a first conductivity type disposed within each of said tubs, said substrate having an upper surface, a first doped region within said substrate disposed along said bottom wall, a second doped region within said substrate disposed along said upper surface and vertically spaced from first region, said first region having, spaced from said side wall, a vertically extending protrusion providing, along the bottom of said substrate, a variable spacing between said first region and said substrate top surface; and wherein, in a first of said tubs, said first region is of said first conductivity type, and, in a second of said tubs, said first region is of a second conductivity type.

7. An integrated circuit according to claim 6 wherein, one of said first and second tubs contains a DMOS device, and the other one of said first and second tubs contains a bipolar device.

* * * * *